United States Patent
Schaffer

(10) Patent No.: US 9,470,506 B2
(45) Date of Patent: Oct. 18, 2016

(54) SYSTEMS AND METHODS FOR RAPID DETECTION OF ROTATION DIRECTION

(71) Applicant: Infineon Technologies AG, Neubiberg (DE)

(72) Inventor: Bernhard Schaffer, Villalch (AT)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 14/182,984

(22) Filed: Feb. 18, 2014

(65) Prior Publication Data

US 2014/0266163 A1     Sep. 18, 2014

Related U.S. Application Data

(60) Provisional application No. 61/779,640, filed on Mar. 13, 2013.

(51) Int. Cl.

| | |
|---|---|
| *G01B 7/30* | (2006.01) |
| *G01R 27/26* | (2006.01) |
| *G01R 33/02* | (2006.01) |
| *G01D 5/14* | (2006.01) |
| *G01B 11/26* | (2006.01) |
| *G01R 33/00* | (2006.01) |
| *G01D 5/245* | (2006.01) |
| *G01P 3/487* | (2006.01) |
| *G01P 13/04* | (2006.01) |

(52) U.S. Cl.
CPC ............ *G01B 7/30* (2013.01); *G01B 11/26* (2013.01); *G01D 5/145* (2013.01); *G01D 5/2451* (2013.01); *G01P 3/487* (2013.01); *G01P 13/045* (2013.01); *G01R 27/2605* (2013.01); *G01R 33/0029* (2013.01); *G01R 33/0035* (2013.01); *G01R 33/02* (2013.01)

(58) Field of Classification Search
CPC ............................. G01R 33/02; G01D 5/145
USPC .................................................... 324/207.25
See application file for complete search history.

(56) References Cited

U.S. PATENT DOCUMENTS

| | | | |
|---|---|---|---|
| 6,242,905 B1 | 6/2001 | Draxelmayr | |
| 6,448,760 B1 | 9/2002 | Neumann | |
| 6,876,311 B2 * | 4/2005 | Sommerfeld | G08C 19/38 301/126 |
| 7,535,215 B2 | 5/2009 | Forster | |
| 8,018,224 B2 | 9/2011 | Kurumado | |
| 2010/0185361 A1 | 7/2010 | Irth | |

* cited by examiner

*Primary Examiner* — Reena Aurora
(74) *Attorney, Agent, or Firm* — Eschweiler & Associates, LLC

(57) ABSTRACT

Embodiments relate to sensor systems and methods for rapidly detecting a direction of rotation. In one embodiment, a sensor system is configured to identify positive and negative peaks of both speed and direction signals and to evaluate a sequential order of the peaks. A direction of rotation can be identified rapidly from the evaluation of the sequential order of peaks.

25 Claims, 3 Drawing Sheets

SYSTEMS AND METHODS FOR RAPID DETECTION OF ROTATION DIRECTION

RELATED APPLICATION

This application claims the benefit of U.S. Provisional Patent App. No. 61/779,640, entitled SYSTEMS AND METHODS FOR RAPID DETECTION OF ROTATION DIRECTION filed Mar. 13, 2013, which is incorporated herein by reference in its entirety.

TECHNICAL FIELD

The invention relates generally to sensors and more particularly to detecting a rotation direction by sensors, such as speed sensors.

BACKGROUND

Sensors are used in many automotive applications to sense speeds. One example is an anti-lock brake system (ABS), which uses sensors to sense wheel speed. Though these types of sensors and systems can vary, in one conventional example an encoder wheel is used with a magnetic field sensing system. As the encoder wheel rotates and the teeth or poles of the wheel pass by, the magnetic field sensor can detect the speed of rotation.

It can also be helpful to know the direction of rotation in many applications. For example, modern automobiles often have "hill-holder" systems, which can prevent a vehicle from rolling backwards when the brake is released after being stopped or parked on an incline, or automatic parking systems, which can parallel park a vehicle with minimal driver interaction once activated. In these and other sensor applications, knowing a direction of movement or rotation in addition to the speed of movement or rotation can be helpful or required.

Conventional systems for detecting direction of movement often are complex and/or cannot detect the direction very quickly. For example, one conventional approach uses two magnetic field sensors spaced apart from one another and from an encoder wheel. In operation, two similar but phase-shifted output signals are obtained, one from each sensor, and the direction of rotation can be obtained from the phase relationship between the two signals. Several signal periods are required, however, before sufficient information is available to determine direction of rotation, which is a significant drawback in many applications.

SUMMARY

In an embodiment, a method of detecting a direction of movement of a target comprises obtaining a first sensor signal related to movement of a target, the first sensor signal comprising a plurality of first signal maxima and first signal minima; obtaining a second sensor signal related to movement of the target, the second sensor signal comprising a plurality of second signal maxima and second signal minima; determining a sequence of occurrence of the first signal maxima, the first signal minima, the second signal maxima and the second signal minima; and determining a direction of movement of the target from the sequence of occurrence.

In an embodiment, a system for detecting a direction of movement of a target comprises a first sensor configured to obtain a first sensor signal related to movement of a target, the first sensor signal comprising a plurality of first signal maxima and first signal minima; a second sensor configured to obtain a second sensor signal related to movement of the target, the second sensor signal comprising a plurality of second signal maxima and second signal minima; and circuitry configured to determine a sequence of occurrence of the first signal maxima, the first signal minima, the second signal maxima and the second signal minima, and to determine a direction of movement of the target from the sequence of occurrence.

In an embodiment, a sensor system comprises a target; a first sensor configured to provide a first sensor signal related to movement of the target sensed by the first sensor, the first sensor signal comprising at least one first signal minima and at least one first signal maxima; a second sensor configured to provide a second sensor signal related to movement of the target sensed by the second sensor, the second sensor signal comprising at least one second signal minima and at least one second signal maxima; and circuitry coupled to the first sensor and the second sensor and configured to detect the first signal minima, the first signal maxima, the second signal minima and the second signal maxima, to determine sequential changes between ones of the first signal minima, the first signal maxima, the second signal minima and the second signal maxima, and to detect a direction of movement of the target based on the sequential changes.

BRIEF DESCRIPTION OF THE DRAWINGS

The invention may be more completely understood in consideration of the following detailed description of various embodiments of the invention in connection with the accompanying drawings, in which.

Figure 1:
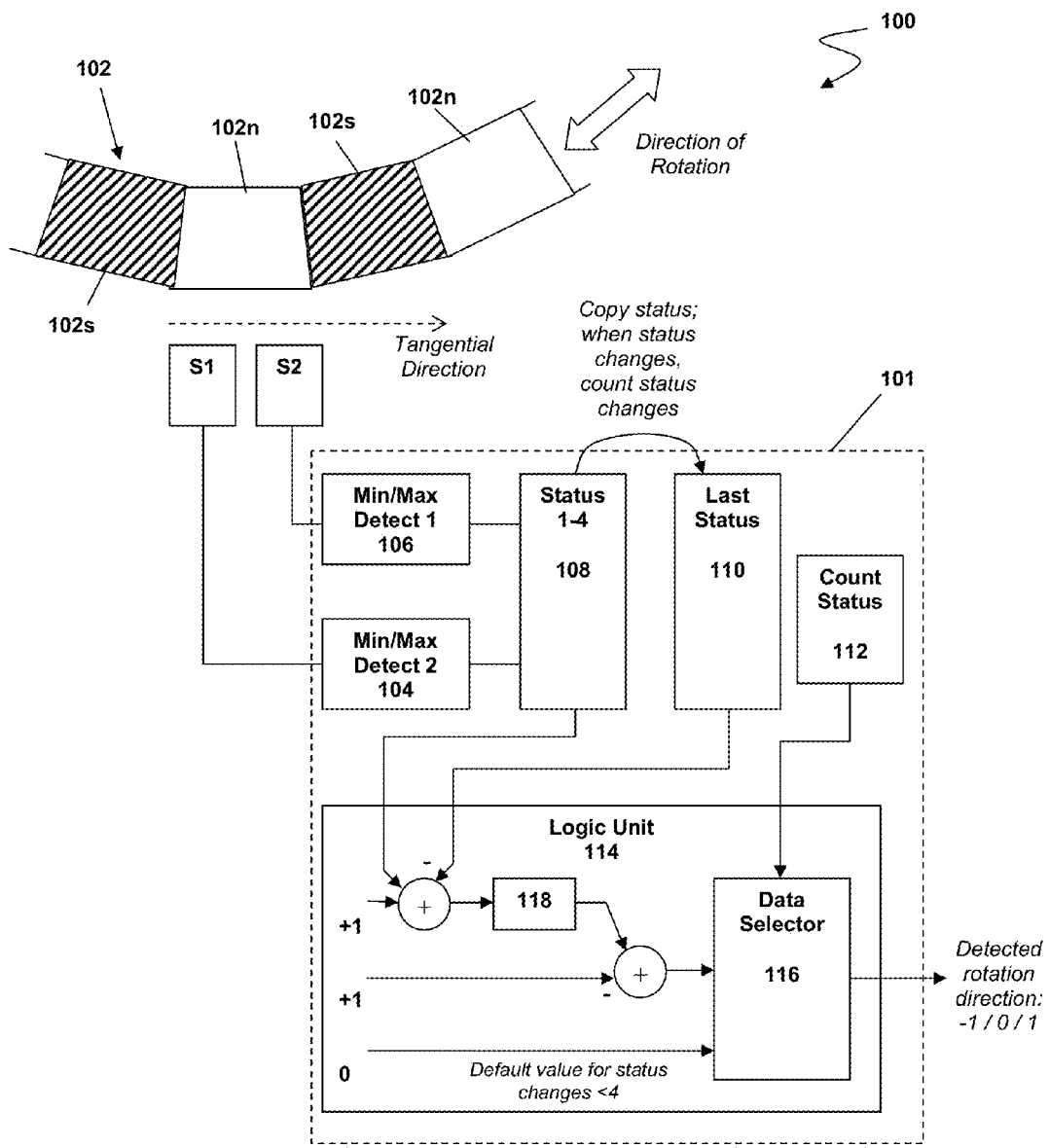
FIG. 1 is a block diagram of a sensor system according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to sensor systems and methods for rapidly detecting a direction of rotation. In one embodiment, a sensor system is configured to identify positive and negative peaks of both speed and direction signals and to evaluate a sequential order of the peaks. A direction of rotation can be identified rapidly from the evaluation of the sequential order of peaks.

Referring to FIG. 1, a sensor system 100 for determining a speed and direction of rotation of a target object is depicted. In system 100, the target object is a pole wheel 102 that rotates clockwise or counter-clockwise. Pole wheel 102 comprises poles of alternating polarity, i.e., north 102$n$, south 102s, north 102n, south 102s, etc., though only a portion of pole wheel 102 is depicted in FIG. 1. A back-bias magnet can be used with pole wheel 102, as appreciated by those skilled in the art, though one is not depicted in FIG. 1. In other embodiments, a tooth or gear wheel, a pole bar, an optically encoded wheel or bar, or a capacitive encoder, along with a suitable sensing device (i.e., magnetic field sensors with pole and tooth wheels, an optical sensor with an optically encoded wheel or bar, a capacitive sensor with a capacitive encoder, etc.), can be used.

The particular type of encoder and sensor is not critical to the various embodiments, as many different sensing systems and applications can be suitable with the underlying concepts discussed herein, as appreciated by those skilled in the art. For purposes of example and illustration, an example embodiment comprising a pole wheel and magnetic field sensors will be discussed herein, though this discussion imposes no limitations on other embodiments, including insofar as some discussion points will be directed toward aspects of magnetic field sensing in particular. Moreover, embodiments can be used in many different applications using different technologies, and can detect the speed and direction of rotational (i.e., using a pole or tooth wheel) or linear (i.e., using an optically encoded bar) movement. Any references herein to one or the other of rotational or linear movement specifically may refer to a particular example or embodiment being discussed and are not to be considered limiting overall.

Two sensor devices S1 and S2 are arranged proximate to but spaced apart from pole wheel 102 and each other. In embodiments, sensor devices S1 and S2 can comprise magnetic field sensor devices, including magnetoresistive (xMR), horizontal and vertical Hall effect, and other magnetic field sensor devices, which can be arranged spaced apart from one another on a substrate, such as a semiconductor substrate (not depicted) and/or as part of a sensor or other system, including a system-in-package or other suitable configuration. For example, in one embodiment at least one of sensor devices S1 or S2 comprises multiple sensor elements, for example two speed sensing elements, arranged on a substrate spaced apart from one another. In another embodiment, each sensor device S1 and S2 comprises multiple elements, such as two speed sensing elements and two direction-sensing elements, each spaced apart from one another and the other sensor elements. Such a configuration can be used, for example, in a differential sensing configuration.

Sensor devices S1 and S2 are arranged to sense a magnetic field induced by rotation of pole wheel 102 in one or the other direction. One sensor device can be sensitive to a component of the magnetic field in a first (i.e., horizontal) direction, and the other sensor device can be sensitive to a magnetic field component in a second (i.e., vertical) direction, or vice-versa or some other suitable arrangement given sensor type and relative position with respect to pole wheel 102. As depicted in FIG. 1, it is a magnetic field component in a direction tangential to the direction of rotation of pole wheel 102 that is of interest, as it relates to the direction of rotation and speed of rotation in that direction. Then, the signal from one sensor device S1 or S2 can be used to determine a speed of rotation of pole wheel 102, while the signal from the other sensor device S2 or S1 can be used to determine a direction of rotation. In this example, S1 will be used as the speed-sensing sensor device, and S2 will be used as the direction-sensing sensor device, though these designations can be reversed in another embodiment.

Figure 2:
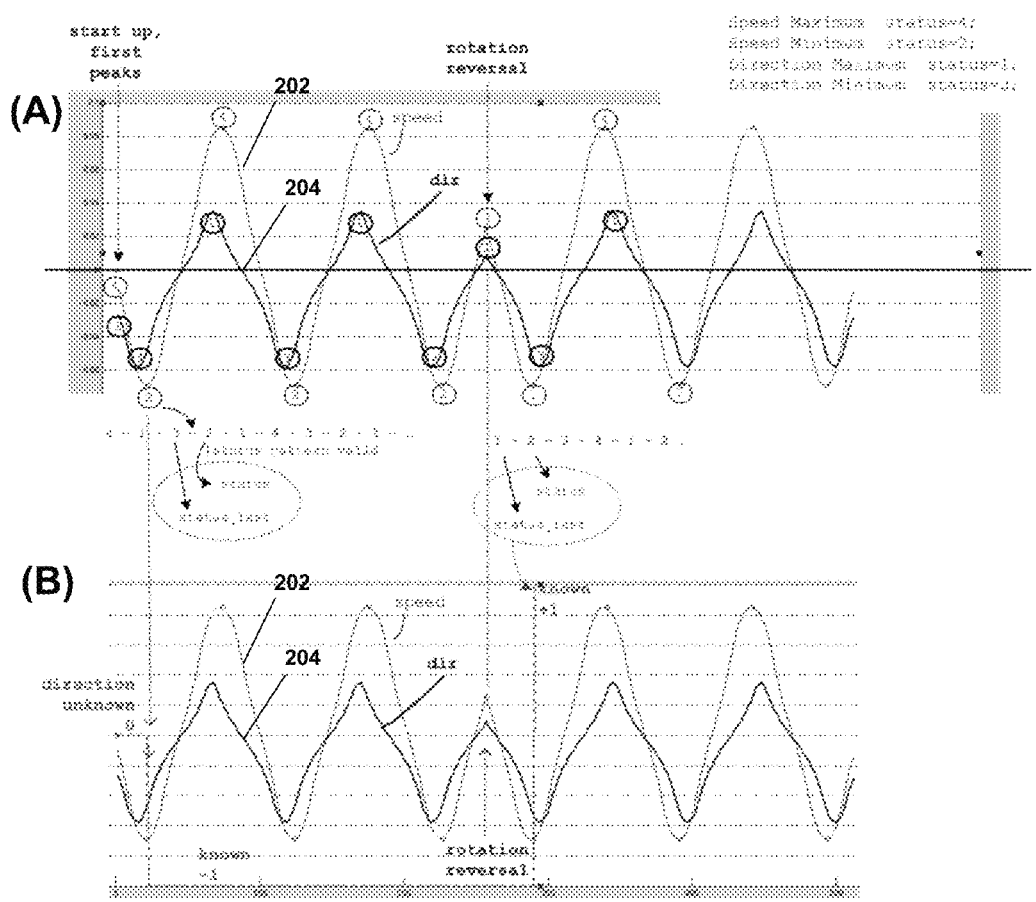
FIG. 2A depicts example waveforms with maxima and minima according to an embodiment.
FIG. 2B depicts the example waveforms of FIG. 2A with points of direction identification marked according to an embodiment.

Referring also to FIG. 2A, example output signals from S1 and S2 are depicted. At 202, an output signal from S1 is depicted, and an output signal from S2 is depicted at 204. Each signal 202 and 204 alternates between minimum (i.e., negative) and maximum (i.e., positive) peaks. The waveforms differ and can include indications of offset errors, distortions and other characteristics which are undesirable generally, though these characteristics are not of concern in determining the direction of rotation in embodiments, in contrast with existing, conventional solutions, and is but one way in which embodiments can be simpler, faster and therefore improved over these other solutions.

Thus, in embodiments, it is the positive and negative peaks of each signal 202 and 204 (i.e., the maxima and minima of the signals) which can be evaluated to provide rapid detection of direction, in addition to speed, of rotation or other movement. In one embodiment, maxima and minima are assigned predefined sequential identifiers or state numbers, for example:

Direction maximum=1
Speed minimum=2
Direction minimum=3
Speed maximum=4

The particular state numbers can vary in embodiments, with the 1-2-3-4 and particular assignment identified above being indicative of but one example embodiment used herein for convenience. Moreover, particular state numbers may be referred to herein as being a first state, second state, etc., with those ordered states not necessarily corresponding to "1," "2," etc. Rather, there are four states of interest, the maxima and minima of each the direction and speed signals, and these four states are identified according to some defined system.

Using the example above, then, and referring to FIG. 2A, the order of the maxima and minima is evaluated. At start-up, the first few peaks may not be actual maxima or minima when compared with other, later-occurring peaks, and the direction of rotation is not yet known, such that whether a peak is a maximum or a minimum cannot yet be determined. It will become clear, however, that this does not matter, as it is the pattern or order of maxima and minima between the two signals that is of interest. Thus, at start-up, the first sampling of signal 202 is assigned 4, and the first sampling of signal 204 is assigned 1, by default. Next, a minimum of signal 204 occurs, which corresponds to 3, followed by a minimum of signal 202 (2), a maximum of signal 204 (1), a maximum of signal 202 (4), a minimum of signal 204 (3), a minimum of signal 202 (2), a maximum of signal 204 (1), a maximum of signal 202 (4), a minimum of signal 204 (3), and a minimum of signal 202 (2). The sequence of maxima and minima in FIG. 2A is:

4-1-3-2-1-4-3-2-1-4-3-2

Beginning with the third value, each transition from state to state increments or decrements by 1 in the pattern chosen, indicating a valid pattern such that the first several values can be discarded as start-up values. In other words, the first transition from (4) to (1) differs by 3, and the second transition from (1) to (3) differs by 2. The next, however, (3) to (2), differs by 1, as does (2) to (1), and (1) to (4) (given that in a four-state sequence, the next value after (1) in decremented order is (4)). Referring also to FIG. 2B, the point at which the direction of movement can be determined is shown by the dashed line, where the first two peaks in this example are discarded because they do not fit with the predefined pattern.

Continuing to record peaks in FIG. 2A, the pattern in full as depicted is:

4-1-3-2-1-4-3-2-1-4-3-2-1/4-2-3-4-1-2

Where the (1) and (4) occur at the same time, a change in direction is taking place, and the pattern then increments by one, rather than decrementing:

1-2-3-4-1-2

The point at which the change of direction is detected is also illustrated by the dashed line in FIG. 2B. In embodiments, the direction can be indicated and output as 1 (a first direction), −1 (a second direction the opposite of the first direction) or 0 (no movement or direction not yet detected), as shown in FIG. 2B. Thus, the direction of rotation or movement can be determined based on whether the repeating state pattern is incrementing or decrementing (i.e., rising or falling). Again, it does not matter what the particular states are, with 1-4 being used simply for arithmetic simplicity and convenience. If 2-4-6-8 was used instead, the same rising and falling sequences could be detected.

Returning to FIG. 1, one example embodiment of circuitry 101 comprising arithmetic and logic blocks to carry out the above direction detection is depicted. Each sensor S1 and S2 is coupled to a minimum/maximum peak detection block 104 and 106, respectively, for detecting the peaks as discussed with reference to FIGS. 2A and 2B. In embodiments, peak detection blocks 104 and 106 use a trend inversion technique that uses a delta value to determine whether a peak has passed and therefore can be detected. A status block 108 coupled to blocks 104 and 106 determines a current status, the number of the most recently occurring peaks. As the status changes, i.e., from (3) to (2), at block 108, the previous status is copied to a last status block 110, and a count status block 112 is incremented. Count status block 112 tracks whether at least four status changes have occurred in order to determine whether the maxima and minima are valid after the initial start-up where maxima or minima are assigned by default and therefore are not reliable for detecting direction. In other words, count status block 112 ensures a sufficient number of status changes have occurred for accurate direction determination to take place. In one embodiment, system 100 can begin to determine the direction after only four status changes have occurred. In embodiments, status block 108, last status block 110 and count status block 112 comprise registers, logic gates, memory or other suitable circuitry configured to carry out the functions discussed herein.

Count status block 112 is coupled to a data selector 116 in a digital arithmetic and logic unit 114. Logic unit 114 receives as input the current status from status block 108 and the previous status from last status block 110. Those signals are combined and fed to a modulo 4 unit 118. Modulo units output the remainder of one integer divided by another integer, i.e., a modulo n outputs the remainder when a is divided by n. In the example embodiment of FIG. 1, modulo unit 118 divides an input a by 4, i.e., a modulo 4, though this can vary in other embodiments in which integers other than 1-4 are used as the states. The operation of modulo 4 unit 118 is described in more detail by example operations of system 100 that follow.

For example, if the status increments from (2) to (3), status block 108 will have (3), and last status block 110 will have (2). When those values are combined in the first arithmetic operation of logic unit 114, a 2 will result (i.e., +1+3−2=2). At modulo 4, unit, a 2 will result (i.e., 2/4=0 remainder 2). At the next arithmetic operation, a 1 results (i.e., 2+−1=1). If at least four status changes have occurred, data selector 116 will output a 1 for a first direction of rotation.

If the status decrements from (4) to (3), on the other hand, status block 108 will have (3), and last status block 110 will have (4). When those values are combined in the first arithmetic operation of logic unit 114, a 0 will result (i.e., +1+3−4=0). At modulo 4, unit, a 0 will result (i.e., 0/4=0 remainder 0). At the next arithmetic operation, a −1 results (i.e., 0+−1=−1). If at least four status changes have occurred, data selector 116 will output a −1 for a second direction of rotation.

Modulo 4 unit 118 is included, at least in part, to accommodate (4) to (1) transitions. For example, status block 108 has (1), and last status block 110 has (4). When those values are combined in the first arithmetic operation of logic unit 114, a −2 will result (i.e., +1+1−4=−2). At modulo 4, unit, a 2 will result, with the −2 input being interpreted simply as an integer 2 (i.e., 2/4=0 remainder 2). At the next arithmetic operation, a 1 results (i.e., 2+−1=1). If at least four status changes have occurred, data selector 116 will output a 1 for a first direction of rotation, capturing the same direction of rotation for the (4) to (1) increment as for the (2) to (3) increment.

Additional circuitry and components can be included to carry out the speed signal processing and other operations as appreciated by those skilled in the art. The block diagram of system 100 in FIG. 1 is a simplified example for illustrating the basic conceptual operation and exemplary features of embodiments discussed herein, and implementations thereof can vary from the examples depicted. For example, other analog and digital signal processing techniques, logic implementations and arithmetic operations than those given by way of example with reference to FIG. 1 can be used to carry out the direction detection methods discussed herein. In one particular example, the second arithmetic operation of logic unit 114 can be omitted in embodiments, and an output signal indicative of direction would instead be −2/0/+2, for example. In other words, the particular logic implementation is not critical but illustrative of one embodiments which could in fact be implemented to carry out embodiments of the direction detection concept.

Applications of embodiments need not be limited to any particular examples given herein. Therefore, while embodiments can have applicability to automotive applications, for example in ABS, hill-holder and parking assistance features, other embodiments can be used in other applications, whether automotive or otherwise. While some or all of the components, systems and/or methods discussed herein can be partially or fully integrated with one of these or some other system or sub-system, or otherwise share resources, in one or more embodiments, this is not required in all embodiments, or in any particular embodiment. Thus, in general, embodiments are not to be considered limited in any way by the particular examples used herein.

Figure 3:
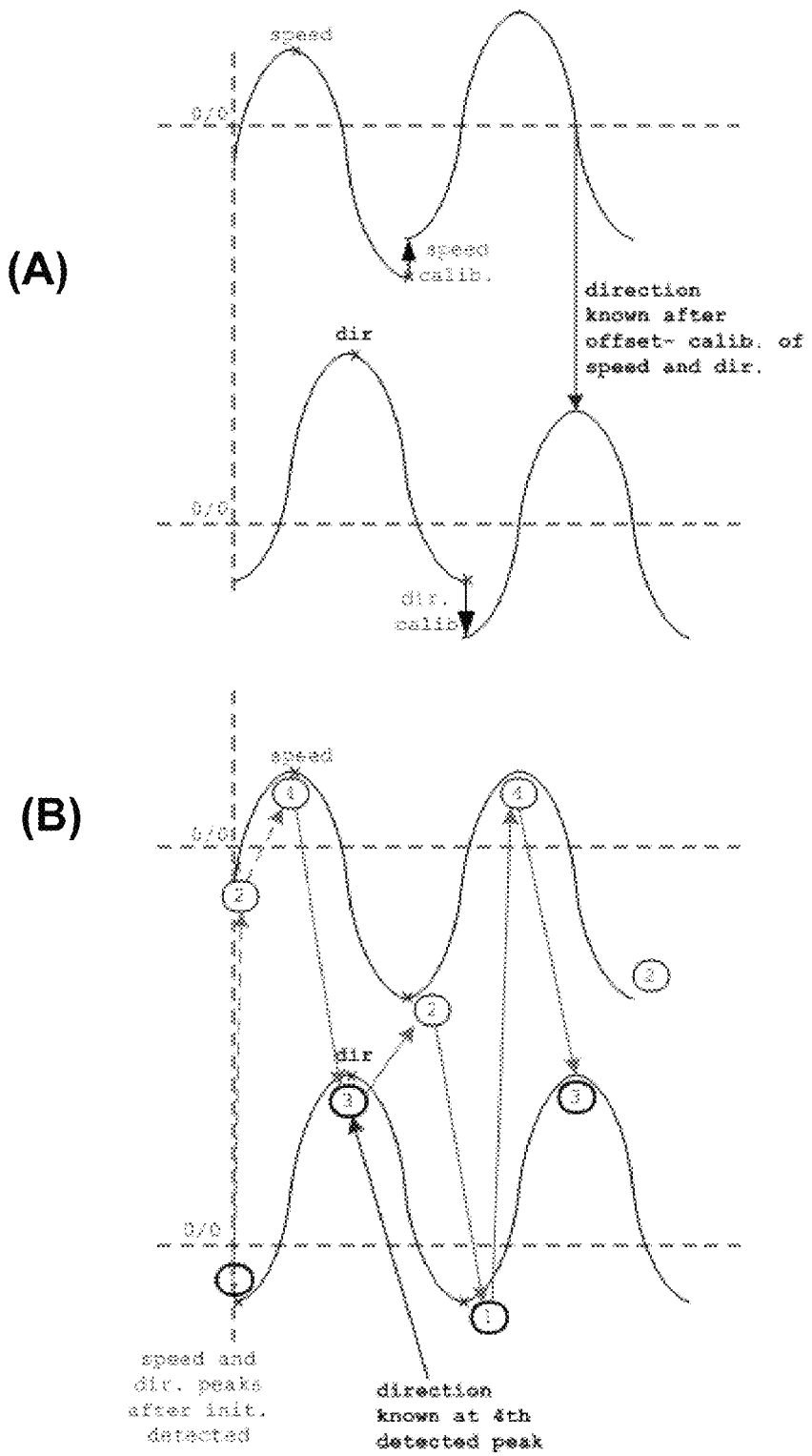
FIG. 3A is a diagram of the speed of direction detection of a conventional approach.
FIG. 3B is a diagram of the speed of direction detection according to an embodiment.

An advantage of embodiments is the simplicity with which a rapid detection of direction can be carried out. Referring to FIGS. 3A and 3B, and as previously discussed, only four status changes, i.e., three sequential maxima/minima transitions, need occur in one embodiment before a direction can be determined. In FIGS. 3A and 3B, a comparison of the speed of direction detection is shown, with a conventional approach shown FIG. 3A and an embodiment as discussed herein in FIG. 3B. As can be seen in FIG. 3B, the direction can be detected after only four peaks have occurred. I contrast, the direction is not known in FIG. 3B until much later, i.e., after eight peaks.

Additionally, sensor calibration and offset and/or distortion correction and compensation needs not be carried out in order to determine direction of rotation or movement, as the peak detection methodology is independent of these characteristics. Moreover, cost savings can be realized by a relatively simple system and method which are compatible with simple, cost-effective sensors.

In an embodiment, a method of detecting a direction of movement of a target comprises obtaining a first sensor signal related to movement of a target, the first sensor signal comprising a plurality of first signal maxima and first signal minima; obtaining a second sensor signal related to movement of the target, the second sensor signal comprising a plurality of second signal maxima and second signal minima; determining a sequence of occurrence of the first signal maxima, the first signal minima, the second signal maxima and the second signal minima; and determining a direction of movement of the target from the sequence of occurrence.

Determining a direction of movement can further comprise identifying a pattern in the sequence; determining a first direction of movement if the pattern has a first characteristic; and determining a second direction of movement if the pattern has a second characteristic. Determining a direction of movement can further comprise identifying a pattern can further comprises assigning a first state identifier to each occurrence of a first signal maximum; assigning a second state identifier to each occurrence of a first signal minimum; assigning a third state identifier to each occurrence of a second signal maximum; assigning a fourth state identifier to each occurrence of a second signal minimum; and determining a sequence of the first, second, third and fourth state identifiers. The first characteristic can be a first order of the first, second, third and fourth state identifiers, and the second characteristic can be a second order of the first, second, third and fourth state identifiers, wherein the second order is the opposite of the first order. Identifying a pattern can further comprise disregarding at least one of the first signal maxima, the first signal minima, the second signal maxima or the second signal minima of the sequence.

Obtaining a first sensor signal related to movement of a target can further comprise sensing movement of the target by a first sensor, and wherein obtaining a second sensor signal related to movement of a target further comprises sensing movement of the target by a second sensor. The first and second sensors can be selected from the group consisting of magnetic field sensors, magnetoresistive sensors, optical sensors and capacitive sensors.

The method can further comprise determining a speed of movement of the target.

Determining a direction of movement of the target can begin once a sequence of least four values is obtained.

In an embodiment, a system for detecting a direction of movement of a target comprises a first sensor configured to obtain a first sensor signal related to movement of a target, the first sensor signal comprising a plurality of first signal maxima and first signal minima; a second sensor configured to obtain a second sensor signal related to movement of the target, the second sensor signal comprising a plurality of second signal maxima and second signal minima; and circuitry configured to determine a sequence of occurrence of the first signal maxima, the first signal minima, the second signal maxima and the second signal minima, and to determine a direction of movement of the target from the sequence of occurrence.

The circuitry can be configured to determine a direction of movement by identifying a pattern in the sequence, determining a first direction of movement if the pattern has a first characteristic, and determining a second direction of movement if the pattern has a second characteristic. The circuitry can be further configured to identify a pattern by assigning a first state identifier to each occurrence of a first signal maximum, assigning a second state identifier to each occurrence of a first signal minimum; assigning a third state identifier to each occurrence of a second signal maximum; assigning a fourth state identifier to each occurrence of a second signal minimum; and determining a sequence of the first, second, third and fourth state identifiers. The first characteristic can be a first order of the first, second, third and fourth state identifiers, and wherein the second characteristic is a second order of the first, second, third and fourth state identifiers, wherein the second order is the opposite of the first order. The circuitry can be configured to disregard at least one of the first signal maxima, the first signal minima, the second signal maxima or the second signal minima of the sequence, in order to identify the pattern.

First and second sensors can be configured to obtain the first and second sensor signals, respectively, by sensing movement of the target. The first and second sensors can be selected from the group consisting of magnetic field sensors, magnetoresistive sensors, optical sensors and capacitive sensors.

The system can further comprise circuitry configured to determine a speed of movement of the target.

The system the circuitry can be configured to determine a direction of movement once the sequence comprises at least four values.

In an embodiment, a sensor system comprises a target; a first sensor configured to provide a first sensor signal related to movement of the target sensed by the first sensor, the first sensor signal comprising at least one first signal minima and at least one first signal maxima; a second sensor configured to provide a second sensor signal related to movement of the target sensed by the second sensor, the second sensor signal comprising at least one second signal minima and at least one second signal maxima; and circuitry coupled to the first sensor and the second sensor and configured to detect the first signal minima, the first signal maxima, the second signal minima and the second signal maxima, to determine sequential changes between ones of the first signal minima, the first signal maxima, the second signal minima and the second signal maxima, and to detect a direction of movement of the target based on the sequential changes.

The circuitry can comprise circuitry configured to determine a most recent occurrence of the first signal minima, the first signal maxima, the second signal minima or the second signal maxima; circuitry configured to store an occurrence of the first signal minima, the first signal maxima, the second signal minima or the second signal maxima immediately preceding the most recent occurrence; and circuitry configured to process output signals of the circuitry configured to determine and the circuitry configured to store to detect the direction of movement of the target. The circuitry can further comprise circuitry configured to determine a number of changes of occurrence between sequential ones of the first signal minima, the first signal maxima, the second signal minima or the second signal maxima. The circuitry can be configured to detect the direction of movement of the target once at least four changes of occurrence have been determined.

The circuitry can comprise an arithmetic and logic unit comprising a modulo unit.

The target can comprise a magnetic target, and the first and second sensors comprise magnetic field sensors.

The first and second sensors can comprise at least one of an optical sensor or a capacitive sensor.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of detecting a direction of movement of a target comprising:
    obtaining a first sensor signal related to movement of a target, the first sensor signal comprising a plurality of first signal maxima and first signal minima;
    obtaining a second sensor signal related to movement of the target, the second sensor signal comprising a plurality of second signal maxima and second signal minima;
    determining a sequence of occurrence of the first signal maxima, the first signal minima, the second signal maxima and the second signal minima; and
    determining a direction of movement of the target from the sequence of occurrence.

2. The method of claim 1, wherein determining a direction of movement further comprises:
    identifying a pattern in the sequence;
    determining a first direction of movement if the pattern has a first characteristic; and
    determining a second direction of movement if the pattern has a second characteristic.

3. The method of claim 2, wherein identifying a pattern further comprising:
    assigning a first state identifier to each occurrence of a first signal maximum;
    assigning a second state identifier to each occurrence of a first signal minimum;
    assigning a third state identifier to each occurrence of a second signal maximum;
    assigning a fourth state identifier to each occurrence of a second signal minimum; and
    determining a sequence of the first, second, third and fourth state identifiers.

4. The method of claim 3, wherein the first characteristic is a first order of the first, second, third and fourth state identifiers, and wherein the second characteristic is a second order of the first, second, third and fourth state identifiers, wherein the second order is the opposite of the first order.

5. The method of claim 2, wherein identifying a pattern further comprises disregarding at least one of the first signal maxima, the first signal minima, the second signal maxima or the second signal minima of the sequence.

6. The method of claim 1, wherein obtaining a first sensor signal related to movement of a target further comprises sensing movement of the target by a first sensor, and wherein obtaining a second sensor signal related to movement of a target further comprises sensing movement of the target by a second sensor.

7. The method of claim 6, wherein the first and second sensors are selected from the group consisting of magnetic field sensors, magnetoresistive sensors, optical sensors and capacitive sensors.

8. The method of claim 1, further comprising determining a speed of movement of the target.

9. The method of claim 1, wherein determining a direction of movement of the target begins once a repeating sequence of least four state identifier values associated with maxima or minima states of the first and second signals is obtained.

10. A system for detecting a direction of movement of a target comprising:
    a first sensor configured to obtain a first sensor signal related to movement of a target, the first sensor signal comprising a plurality of first signal maxima and first signal minima;
    a second sensor configured to obtain a second sensor signal related to movement of the target, the second sensor signal comprising a plurality of second signal maxima and second signal minima; and
    circuitry configured to determine a sequence of occurrence of the first signal maxima, the first signal minima, the second signal maxima and the second signal minima, and to determine a direction of movement of the target from the sequence of occurrence.

11. The system of claim 10, wherein the circuitry is configured to determine a direction of movement by identifying a pattern in the sequence, determining a first direction of movement if the pattern has a first characteristic, and determining a second direction of movement if the pattern has a second characteristic.

12. The system of claim 11, wherein the circuitry is configured to identify a pattern by assigning a first state identifier to each occurrence of a first signal maximum, assigning a second state identifier to each occurrence of a first signal minimum;

assigning a third state identifier to each occurrence of a second signal maximum;

assigning a fourth state identifier to each occurrence of a second signal minimum; and determining a sequence of the first, second, third and fourth state identifiers.

13. The system of claim 12, wherein the first characteristic is a first order of the first, second, third and fourth state identifiers, and wherein the second characteristic is a second order of the first, second, third and fourth state identifiers, wherein the second order is the opposite of the first order.

14. The system of claim 11, wherein the circuitry is configured to disregard at least one of the first signal maxima, the first signal minima, the second signal maxima or the second signal minima of the sequence, in order to identify the pattern.

15. The system of claim 10, wherein the first and second sensors are configured to obtain the first and second sensor signals, respectively, by sensing movement of the target.

16. The system of claim 15, wherein the first and second sensors are selected from the group consisting of magnetic field sensors, magnetoresistive sensors, optical sensors and capacitive sensors.

17. The system of claim 10, further comprising circuitry configured to determine a speed of movement of the target.

18. The system of claim 10, wherein the circuitry is configured to determine a direction of movement once the sequence comprises at least four state identifier values associated with maxima or minima states of the first and second signals.

19. A sensor system comprising:
a target;
a first sensor configured to provide a first sensor signal related to movement of the target sensed by the first sensor, the first sensor signal comprising at least one first signal minima and at least one first signal maxima;
a second sensor configured to provide a second sensor signal related to movement of the target sensed by the second sensor, the second sensor signal comprising at least one second signal minima and at least one second signal maxima; and
circuitry coupled to the first sensor and the second sensor and configured to detect the first signal minima, the first signal maxima, the second signal minima and the second signal maxima, to determine sequential changes between ones of the first signal minima, the first signal maxima, the second signal minima and the second signal maxima, and to detect a direction of movement of the target based on the sequential changes.

20. The sensor system of claim 19, wherein the circuitry comprises:
circuitry configured to determine a most recent occurrence of the first signal minima, the first signal maxima, the second signal minima or the second signal maxima;
circuitry configured to store an occurrence of the first signal minima, the first signal maxima, the second signal minima or the second signal maxima immediately preceding the most recent occurrence; and
circuitry configured to process output signals of the circuitry configured to determine and the circuitry configured to store to detect the direction of movement of the target.

21. The sensor system of claim 20, wherein the circuitry further comprises circuitry configured to determine a number of changes of occurrence between sequential ones of the first signal minima, the first signal maxima, the second signal minima or the second signal maxima.

22. The sensor system of claim 21, wherein the circuitry is configured to detect the direction of movement of the target once at least four changes of occurrence have been determined.

23. The sensor system of claim 19, wherein the circuitry comprises an arithmetic and logic unit comprising a modulo unit.

24. The sensor system of claim 19, wherein the target comprises a magnetic target, and the first and second sensors comprise magnetic field sensors.

25. The sensor system of claim 19, wherein the first and second sensors comprise at least one of an optical sensor or a capacitive sensor.

* * * * *